United States Patent [19]

Paphitis

[11] 4,230,991
[45] Oct. 28, 1980

[54] DIGITAL FREQUENCY PROCESS AND METHOD USING FREQUENCY SHIFTING TECHNIQUES, ESPECIALLY FOR LOW FREQUENCY MEASUREMENTS

[76] Inventor: Alexandre Paphitis, Rua Djalma Ulrich 57, Apt. 1006, Copacabana, 20,000 Rio de Janeiro ZC-37, Brazil

[21] Appl. No.: 941,495

[22] Filed: Sep. 11, 1978

[51] Int. Cl.³ .............................................. H04B 1/02
[52] U.S. Cl. .................................. 328/140; 328/168; 324/78R; 368/119
[58] Field of Search .................... 324/186, 187, 78 R; 328/140, 168, 160

[56] References Cited

U.S. PATENT DOCUMENTS 4,107,600  8/1978  McMannis ........................... 324/186

OTHER PUBLICATIONS

Howlick and Bertolucci, "A New Type of Digital Frequency Multiplier," *Proceedings of IEEE*, Sep. 1975, p. 1365.
Gimmel, "A Digital Method of Frequency Multiplication and its Application to Numeric Spectrum Analysis of Periodic Signals," IEEE, Jun. 1977, pp. 181-183.
Gimmel, "An *Improved Type of Digital Frequency Multiplier Circuits and Systems,*" May, 1977.
Fichtenbaum "Counter Inverts period to measure low frequency Electronics," Mar. 4, 1976, pp. 100-101.

*Primary Examiner*—Alfred E. Smith
*Assistant Examiner*—Thomas P. O'Hare
*Attorney, Agent, or Firm*—Beveridge, De Grandi, Kline & Lunsford

[57] ABSTRACT

A programmable number of pulses N, of one or more auxiliary frequencies fa, is inserted between pulses of the frequency $f_1$ to be processed. The resulting frequency $N.f_1$, where N is a positive number (N can be fractional), is at any moment proportional to input frequency $f_1$ where N, the proportionality factor, varies at will and can assume any positive number value. Pulse insertion results in a frequency shift of positive or negative value and succeeds continuously and without any information loss i.e. the pulse train has not to be interrupted and is processed "on (the) line". The same method described used for higher frequencies eliminates the known ±1 count problem as it can register fractions of a pulse.

22 Claims, 6 Drawing Figures

$Y = A\bar{B} + \bar{A}B$

DIGITAL FREQUENCY PROCESS AND METHOD USING FREQUENCY SHIFTING TECHNIQUES, ESPECIALLY FOR LOW FREQUENCY MEASUREMENTS

BACKGROUND OF THE INVENTION

A. Field of the invention

A frequency counter, being a digital instrument, is limited in its range by the speed of its logic circuitry. Today the state of the art at high-speed logic allows the construction of direct (without any pre-scaling) digital frequency counters in IEEE TRANSACTIONS ON INSTRUMENTATION AND MEASUREMENT—December 1977—Volume I.M.26—Number 4—p.p. 396-402: DEVELOPING PROGRAMMABLE BROAD-BAND COUNTING CIRCUITS FOR HIGH-SPEED DATA TRANSMISSION AND FREQUENCY DIVISION by A. PAPHITIS.

Using down conversion techniques, frequency measurement extension up to 40 GHz is made possible.

In conventional counters, however, accuracy drops with input frequency if the gate period, during which the measurement occurs, is held constant. With low frequencies absurdly long measurement times would be needed to keep resolution.

To measure a frequency of 1Hz with 1% precision, for instance, the gate period should be larger than 100 seconds.

The method used to shift a given frequency of unknown value to, in the case of low frequency counters, higher frequency values that can be measured, fast and precisely, can be used in other fields too. A typical application would be a digital mixer, or modulator and demodulator, system as the product $Nf_1$ can be interpreted as the product of two frequencies $f_1$ and $f_2$ where $N=f_2$.

B. Description of the Prior Art

Of the various methods to get around the problem of low frequency counters, the most notable are reciprocal counters (R.C.'s) and counters using PHASE-LOCKED LOOPS (PLL's). R.C.'s measure the period and then arithmetically convert to get the frequency. R.C.'s presently work to 500 MHz, but the advantage of constant resolution disappears when the input frequency exceeds the reciprocal unit clock frequency, usually 10 MHz, and a second counter or a higher unit clock frequency is needed to measure such frequencies accurately, both being extremely uneconomical. R.C.'s are very complex circuits. Several counters of various stages, depending on frequency range and accuracy requirements to be covered, are needed. As described for instance in ELECTRONICS, Mar. 4, 1976, p.p. 100-101: COUNTER INVERTS PERIOD TO MEASURE LOW FREQUENCY by Matthew L. Fichtenbaum, several counter stages are needed to measure the period of the input signal by counting the number of unit clock frequency pulses, N, in one period and inverting the result. While with a conventional counter a 1% accuracy is obtained without need of changing the frequency range, for frequencies above 100 Hz and a gate time of 1 second, this is not the case in R.C.'s. To measure, for instance 100 KHz with the above mentioned unit clock frequency of 10 MHz, 100 pulses of the clock frequency are registered. To measure 100 Hz with the same frequency would require a five stage decimal counter merely to count the period duration. Inversion is now performed by dividing a number K (which is much larger than N if the lowest frequency to be counted is for instance 0.01 Hz, then $N=10^9$) by the count of N where a bit comparator of several stages (if $N=10^9$, nine stages) to compare the period count with the count of another auxiliary counter of equal length (in the example, nine stages) and a third counter (of more than nine stages) to count K are necessary and lastly, is necessary too, the readout display counter. Several techniques are known to reduce this effect but the main problem remains the same, which ends always in a big implementational effort. Further another serious disadvantage is the loss of information since, during inversion, the counter input is disabled. As we shall see later it is important to note that this is the case even if the input frequency did not change or presents slight change.

Consequently a frequency input signal may not be continuously monitored which is important for instance in ratemeters (heart rate monitoring, motor regulation applications, car velocity and acceleration control, etc.)

Of the many known low frequency measurement methods, the R.C.'s have been mentioned because of their popularity among instrument manufacturers. It should be mentioned, however, that the PLL approach, although versatile, has its share of problems. The frequency limit here is 100 MHz and it is obvious that it is easier to build a 100 Mhz pulse counter than to implement a 100 MHz PLL. This, however, is not the main difficulty. PLL's tend to lock on subharmonics and behave strangely with narrow pulses and modulated FM and AM signals. Because of high frequency limitations of LSI, PLL's will probably never reach frequencies much higher than 100 MHz. Last but not least, PLL prices are still high.

When measuring events between two time marks (or time intervals between two events) several error terms add together, for example, time base error, trigger error, etc. as described in ELECTRONIC DESIGN 24, Nov. 22, 1974, p.p. 162-167: MEASURE TIME INTERVAL PRECISELY by David Martin. One of the error sources described in the above mentioned work is the so-called ±1 count. This refers in the case of frequency (and not period) measurement to the fact that pulse counting always provides this inherent uncertainty, since there can usually be no guarantee of coherence between the input frequency and the gate time (in measuring periods, there is no coherence between input frequency and counted clock).

One of the consequences of the ±n count ambiguity (which can be greater than ±1) is that frequency counters are unable to register fractions of a pulse. Precision drops drastically with input frequency. A high frequency counter of a 1 Hz resolution at 100 MHz means a $\Delta f/f = 1\ Hz/10^8\ Hz = 10^{-8}$. For the same counter at 100 Hz we have:
ti $\Delta f/f = 1/100 = 10^{-2}$.

Another important factor in counting pulses is the short term stability of the time base oscillator, related with fast phase fluctuations and random frequencies generated along with the desired frequency. The less time the measurement takes, the greater the uncertainty (for times of one second and less). Measuring very short periods, there is this additional limitation, forcing averaging, by measuring more than one event and dividing by the number of measurements to obtain the result, such method meaning loss of resolution.

OBJECTS AND SUMMARY OF THE INVENTION

It is a primary object of the present invention to provide a direct frequency and pulse counting method to cover the low frequency range, below 100 Hz with frequencies of the order of 0.01 Hz or less, and the higher than 100 Hz frequency range up to 1 GHz or higher using only one frequency counter and measuring directly frequency values i.e. number of input pulses of the unknown pulse frequency $f_1$ divided by the gate period of the time base during which these pulses are being measured, in lieu of measuring the period of the unknown frequency $f_1$ and then inverting to obtain the frequency $f_1$.

Another object of the present invention is to provide a novel arrangement for multiplying an unknown and constantly varying input frequency or number of input pulses of an incident pulse train by a controllable frequency or frequencies of known constant or varying values.

In its broadest aspect the present invention comprises a digital frequency process method in which a relatively high auxiliary frequency $f_b$ which is normally known is consecutively diminished by dividing by factors of $2^A$ ($2^A$ is an integer) until a comparison of the results with said first frequency $f_1$ shows said result to be equal to $10^z f_1$ where $Z=1,2,3 \ldots$ Said diminishing of the auxiliary frequency including the final step of dividing by a fraction of $2^A$ to satisfy the above condition when $f_b/f_1$ is not a power of $2^A$.

The frequency process method of this invention, in another aspect thereof comprises providing a first train of pulses having a first frequency $f_1$; dividing said first train of pulses into a plurality of x second trains of pulses; counting n pulses of a second frequency $f_b$ for each pulses of each second train of pulses; and providing an output related to the total number of pulses of said second frequency which have been counted during a time base, said first and second frequencies obeying the following condition:

$$nf_1 \geq f_b \geq (n/x)f_1.$$

In the preferred embodiment described herein the first train of pulses is divided into two trains of pulses (X=2) which are inverted with respect to each other and have half the frequency of said first frequency. In this case ten pulses of the second frequency (N=10) are injected between each second train pulse and the condition to be obeyed is $$10f_1 \geq f_b \geq 5f_1$$

It will be seen from the above and from the following description of the preferred embodiment that the present invention uses "pulse multipliers" to produce auxiliary pulse trains and so on.

The invention uses "pulse multipliers" to produce auxiliary pulse trains of frequencies higher than the input frequency and then combines the auxiliary pulse trains to obtain an exact proportionality between $f_1$ and the combined frequency $f_s$ of higher frequency than $f_1$. Low and very low input frequencies are thus "frequency translated" or "frequency shifted" to a higher frequency range of a higher frequency precision, thus overcoming the known difficulty of conventional frequency counters where resolution drops with input frequency, the gate period, during which measurement occurs, being kept constant.

The invention will be best understood from the following description when read in conjunction with the accompanying drawings.

DESCRIPTION OF THE PREFERRED EMBODIMENT

Figure 1:
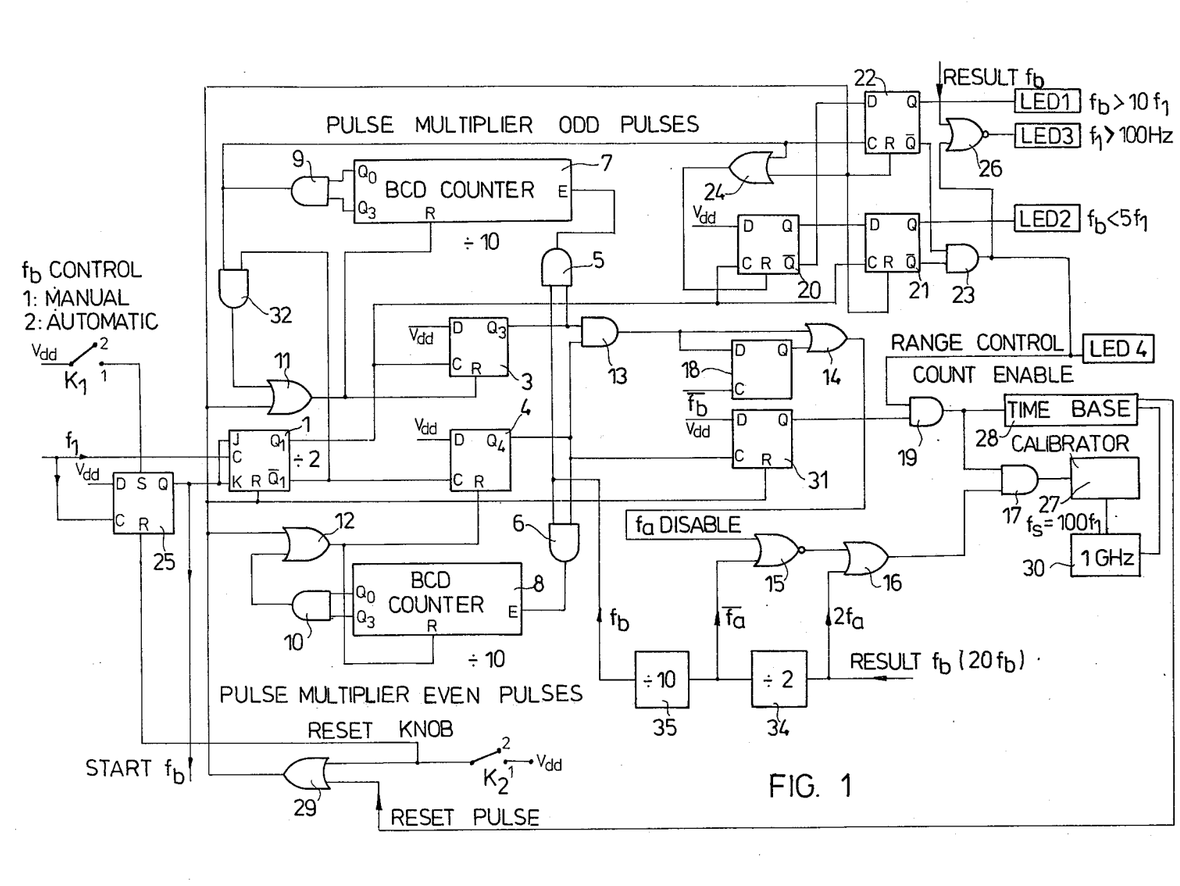
FIG. 1 is a block diagram of version 1 of a digital frequency shifter which is the preferred embodiment of the invention.

Referring now to the drawings, FIG. 1 shows a block diagram of a FREQUENCY SHIFTER digital circuit which is the preferred embodiment of the present invention. All the integrated circuits mentioned in the following description are of the CMOS logic family, manufactured by FAIRCHILD, U.S.A. (or MOTOROLA INC., U.S.A.) among other manufacturers. Clearly other types of logic families like high frequency ECL 1, II or III etc. or cheap TTL circuits are equally adequate. In the discussion of the preferred embodiment two versions will be distinguished depending on whether the auxiliary frequencies $f_b$ and $f_a$ are manually or automatically controlled.

Version 1: Manual control of $f_b$ and $f_a$

According to this version switch $K_1$ in FIG. 1 is closed (position 1). The Q output of D flip flop 25, which can be of the type 4013 (14013) of the CMOS logic family, is continuously set to logic one by applying the voltage $V_{dd}$ through switch $K_1$ to its set input S. J K flip flop 1, which can be of the type 4027 (14027) has then both its inputs J and K tied on logic one potential, over Q output of IC 25. JK flip flop 1 is set to logic zero (output Q1=logic zero) by applying a logic one at its Reset input R through OR gate 29.

There are two ways to reset through OR gate 29. One is by momentarily closing switch 2 (position 1) whereby a logic one ($V_{dd}$), which in the case of CMOS corresponds to the positive connection of the power supply, is manually generated to give the RESET after the power supply is turned on. The other manner of resetting D flip flop 25 by means of a RESET PULSE which appears after each gate period of the time base $t_G$. This gate period $t_G$ is usually chosen to be 0.1 sec or 1 second or 10 sec etc. and is exactly the time period during which the input pulses of the (unknown) input frequency are counted.

The pulses of the frequency to be measured are applied to the clock input of JK flip flop 1 which acts as a divide-by-two unit. The first input pulse of $f_1$ turns $Q_1$ high (logic one) and $\bar{Q}_1$ low (logic zero), the second turns $Q_1$ low and $\bar{Q}_1$ high and so on. Odd pulses thus activate $Q_1$ and even pulses activate $\bar{Q}_1$. The signals at $Q_1$ and $\bar{Q}_1$ are applied, respectively, to the clock inputs C of D flip flops 3 and 4 whose inputs ($V_{dd}$) are high. This turns $Q_3$ or $Q_4$ high which in turn is applied to a respective one of the two inputs of AND gates 5 or 6 of which the other input is tied to an auxiliary frequency $f_b$. The enabled AND gate 5 or 6 transmits the pulses of $f_b$ to the Enable input E of a respective counter 7 or 8 which, in this case, is a Binary Coded Decimal counter with separated outputs $Q_0$ through $Q_3$ to give a count readout in BCD code. These counters can be of the type 4518 (14518) which counts the trailing edges of the pulses applied to its Enable Input E, provided Clock Input C and Reset Input R are at $V_{ss}$ potential (negative connection of the power supply corresponding to the logic zero of the CMOS). The count of ten (BCD number nine) pulses of the counter 7 is decoded at outputs $Q_0$ and $Q_3$, through AND gate 9, and AND gate 32 (when enabled by $\overline{Q}_1$, to reset D flip flop 3 and counter 7. The enable condition of AND gate 32 will be discussed later. The ten count of counter 8 is decoded at corresponding outputs $Q_0$ and $Q_3$, through AND gate 10 and OR gate 12 to reset D flip flop 4 and counter 8. When one (but not both) counter is still counting, AND gate 13 is disabled because one of its inputs $Q_3$ or $Q_4$ is logic zero, this zero then applied to one of the inputs of OR gate 14, of which the output $f_a$ DISABLE is applied to one of the inputs of NOR gate 15 which acts as an inverter. Its output is then $f_a$ (its other input being $\bar{f}_a$) and is OR'ed with auxiliary frequency $2f_a$ to give again $f_a$ at the output of OR gate 16. When both 7 and 8 are counting the output of AND gate 13 is logic one (its two inputs $Q_3$ and $Q_4$ are logic ones) which disables NOR gate 15 through OR gate 14 to give a logic zero at its output, which, in turn, is OR'ed with the auxiliary frequency $2f_a$ to give $2f_a$ at the output of OR gate 16.

According to the above description, for each pulse counted by counter 7 or 8 there appear ten pulses of frequency $f_a$ or $2f_a$ at the output of OR gate 16. After the tenth pulse of either counter 7 or 8, the output of AND gate 13 should remain logic one for one more period (except for $10f_1 = f_b$, in which case AND gate 13 is always disabled). This is done by applying the output of AND gate 13 to the D input of D flip flop 18 whose output Q remains logic one for one more period of $\bar{f}_b$ after both its input D and the output of AND gate 13 have turned logic 0. The output of D flip flop 18 is applied to the second input of OR gate 14.

In order to have the desired proportionality between the input pulse frequency $f_1$ on the one hand and the pulse frequency at the output of OR gate 16 on the other, the following conditions must be met:

$$2nf_1 \geq f_b \geq nf_1 \qquad (1)$$

$f_a$ is chosen to be $$f_a = mf_b \qquad (2)$$

where both m and n are positive numbers.
In the special case discussed $$m = 2n = 10 \qquad (3)$$

and equations 1 and 2 simplify to:

$$10f_1 \geq f_b \geq 5f_1 \qquad (4)$$

or with $$f_a = 10f_b \qquad (5)$$

$$100f_1 \geq f_a \geq 50f_1 \qquad (6)$$

Equation 4 indicates that if auxiliary frequency $f_b$ is fixed, the input frequency can vary up to one octave, from $f_b/5$ to $f_b/10$.

The second condition to be met is that the count is only then right if counting of the pulses at the output of OR gate 16 is started after the first logic one level appears at $\overline{Q}_1$ which, as already mentioned, turns $Q_4$ a logic one which makes output Q of D flip flop 31 a logic one applied to one of the inputs of AND gate 19. The other input of AND gate 19 receives a logic one from AND gate 23, provided equations (4) and (5) are satisfied. Equation (4) is controlled as follows: D flip flops 20 and 21 receive the output ($Q_1$) pulses of J K flip flop 1 which are applied to their respective clock inputs C. D input of D flip flop 20 is a logic one ($V_{dd}$) so that after the first clock pulse its Q output will turn logic one and be applied to the D input of D flip flop 21 whose output Q will go high after the second clock pulse since its D input was logic zero up to that moment (reset at beginning of the count by the application of a logic one to its R input by OR gate 29 which also resets D flip flop 22). This activates the Light Emitting Diode LED2, provided the D input of flip flop 22 remains at logic one, this being conditioned to the output of D flip flop 20. D flip flop 20 is reset through OR gate 24 either by the reset pulse coming from OR gate 29 at the beginning of each new count or by BCD counter 7 having counted ten pulses which produces a logic 1 at the output of AND gate 9.

If counter 7 counts less than 10 pulses of the frequency $f_b$ for the time period of two periods of $f_1$ ($f_{\frac{1}{2}}$ always appears at $Q_1$) or less than 5 pulses for one period of $f_1$, then the reset pulse at D flip flop 20 arrives after the second clock pulse has arrived at D flip flop 21 whereby the Q output of the latter turns logic one to make LED2 indicate that $$f_b < 5f_1$$

and that equation 4 is not satisfied.

After passing through AND gates 9 and 32 and OR gate 11, the reset pulses of counter 7 are used to disable its input E by resetting D flip flop 3, whose output $Q_3$ turns logic zero to disable AND gate 5.

In order to reset D flip flop 3, however, AND gate 32 must be enabled by a logic one at the $\overline{Q}_1$ output of J K flip flop 1. If there is no logic one at the $\overline{Q}_1$ output of J K flip flop 1 after 10 counted pulses of $f_b$, then this means that $f_b > 10f_1$, because counter 7 started counting after the first pulse of $f_1$ had been applied to the J and K inputs of J K flip flop 1 and $\overline{Q}_1$ turns logic one after the second pulse so D flip flop 3 is not reset and counter 7 counts 10 more pulses to give a clock pulse which is applied to the C input of D flip flop 22 whose D input is logic one because the output $\overline{Q}$ of D flip flop 20 has already been reset by the first reset pulse of counter 7. After the application of this clock pulse to D flip flop 22, the Q output of the latter turns logic one and activates LED 1 to indicate that $10f_1 \geq f_b$ is not satisfied. Should equation 4 be satisfied, then the $\overline{Q}$ outputs of D flip flops 21 and 22 remain on logic level one and are used to enable AND gate 23 which in turn serves to enable AND gate 19. At the same time the second input pulse of $f_1$ must have turned the $\overline{Q}_1$ of J K flip flop 1 to logic one which in turn is applied to the clock input of D flip flop 4 whose output $Q_4$ goes logic one and is applied to the clock input of D flip flop 31 of which the D input is on logic one ($V_{dd}$). A logic one then appears at the output of AND gate 19 to provide the COUNT ENABLE signal, indicating that the circuit is ready to count and that the pulses at the output of OR gate 16 are in a suitable proportion to the number of pulses at the input of the frequency $f_1$ to be measured.

It is important to note that after the COUNT ENABLE appears, the circuit is capable of counting even fractions of a period of the frequency $f_1$ since, after the second pulse edge of $f_1$, the pulses at the output of OR gate 16 are always proportional to the number of input pulses, fractions included. Thus a fraction of a pulse of $f_1$ after mentioned first pulse of $f_1$ counter 30 is able to display the exact value of input frequency $f_1$ provided $f_1$ varies according to inequality 4.

The "COUNT EMABLE" output of AND gate 19 is applied both to the time base 28 to start the gate time period $t_G$ and to one of the inputs of AND gate 17 to the other input of which is applied the output of OR gate 16 to enable this gate at the pulse frequency of OR gate 16. The output of AND gate 17 is then calibrated by calibrator 27, which in this case is done simply by shifting the decimal point by two positions to the left, and then applied at the input of a high frequency counter 30 which can reach up to 1 GHz or higher.

Input signals higher than 100 Hz to couner 30 are not of importance to the invention as presently described and will thus not be further considered. Reference is made, however, to the literature mentioned where such applications are extensively discussed and improved. The basic object of this invention, moreover, is to show that low frequency signals (less than 100 Hz) can be frequency shifted to higher frequency values and these registered by a common counter.

The calibrator 27 effects the divide-by-one-hundred shifting the decimal point of counter 30, which counts 100 pulses of frequency $f_a$ or $2f_a$ per input pulse of frequency $f_1$ being able of registering even fractions of a pulse, two positions to the left, this being done by applying a logic one (or zero) to the corresponding decimal point of the display.

The auxiliary frequencies $f_a$ and $f_b$ are derived by dividing the auxiliary frequency $20f_b$ (RESULT $f_b$) by 2 and 10 using suitable integrated circuits 34 and 35.

Figure 2A:
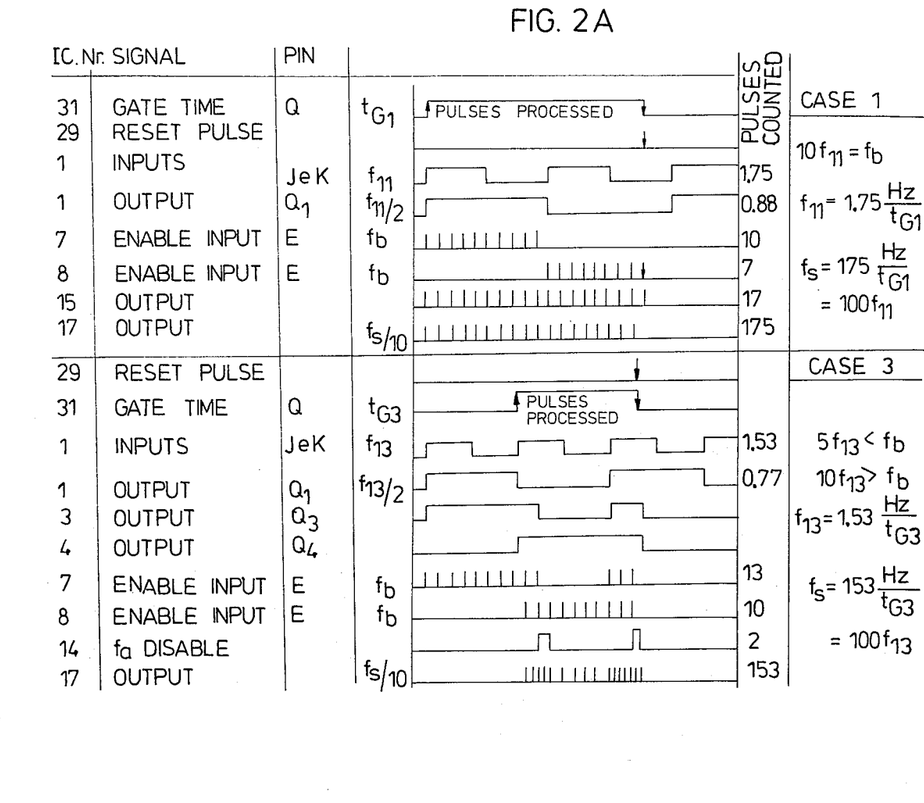
FIGS. 2A and 2B are pulse charts showing the time of the various pulses of FIG. 1.

Referring now to FIG. 2A, case 1 is an example where $10f_{11} = f_b$ and counters 7 and 8 alternatively count 10 pulses of auxiliary frequency $f_b$, per input pulse of $f_{11}$. There is no pulse-overlapping (Q outputs of D flip flops 3 and 4 both high) and hence AND gate 13 is always disabled and counter 30 always receives the pulses of $f_a$. The RESET PULSE from the time base, resets the system after 1.75 pulses of $f_{11}$ that is between the 18th and 19th pulses of $f_b$ or after 175 pulses of $f_a$. After calibration by 27 (decimal point shifting) the readout at counter 30 is 1.75. In this special case there is always proportionally between $f_{11}$ and $f_S$, so $t_{G1}$ starts with the very first pulse of $f_{11}$ (Case 2 and 3 only after $\overline{Q}_1$ turns high). All pulses counted by counters 7 and 8 are processed, that is to say, each one of them gives ten output pulses at OR gate 16.

Figure 2B:
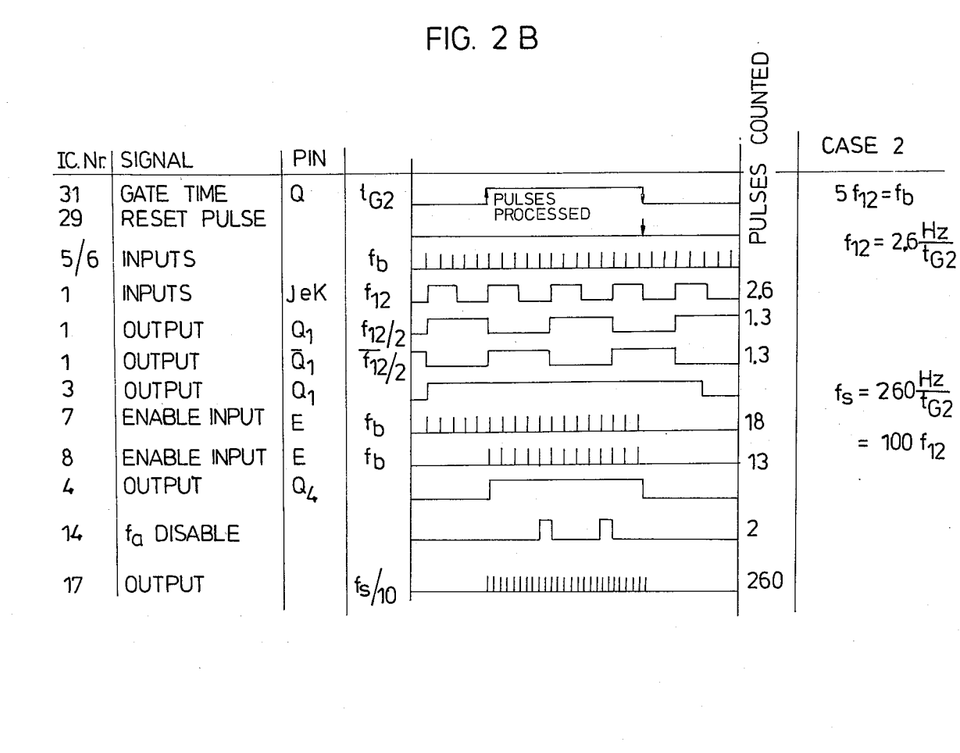

Case 2 in FIG. 2B is the opposite or lower limit for $f_b$ where $f_b = 5f_{12}$. After the second input pulse edge of $f_{12}$ $\overline{Q}_1$ of J K flip flop 1 turns high) there is always pulse overlapping. As we see from the FIG. 2, only after the second input pulse edge of $f_{12}$ is there proportionality between frequencies $f_{12}$ and $f_S$.

As already discussed, D flip flop 18 together with OR gate 14 is used to keep the "$f_a$ DISABLE" at logic one which otherwise would not be the case: after each tenth pulse of either counter 7 or 8 (except for $10f_1 = f_b$), counter 30 receives pulses of the frequency of $f_S = 100f_{12}$ whereby, after calibration by 27, it displays $f_{12}$. Counter 7 counts 23 pulses but only 18 of them are processed.

Case 3 is the general case of $f_b/5 > f_{13} > f_b/10$.

After the second input pulse edge of $f_{13}$ $\overline{Q}_1$ of J K flip flop 1 turns high and, as before, the time base enables the start of $t_{G3}$. Fifteen pulses of $f_b$ or 153 of $f_a$ (and $2f_a$) are measured. Once more counter 30 counts pulses of the frequency $100f_{13}$ but displays $1.00f_{13}$. Note that counter 7 counts 13 pulses but only 5 are processed.

It is further important to note that if we consider the frequency $20f_b$ as input frequency for the circuit of FIG. 1 and frequency $f_1$ as a frequency shift control signal the frequency $f_S$ at the output of OR gate 17 is $f_s = 20f_b/K$ where $$K = 20f_b/f_s \qquad (7)$$

and $2 \geq K \geq 1$

Hence the circuit of FIG. 1 is effectively no more than a divide by K unit for frequency $20f_b$.

Version 2: Digital automatic control of $f_b$ and $f_a$

The DIGITAL AUTOMATIC FREQUENCY CONTROL, abbreviated DAFC, shown in FIG. 3, works as follows. In this mode of operation, switch $K_1$ of FIG. 1 is in position 2 (automatic) whereby set inputs S of D flip flop 25 is logic zero. The first input pulse of the unknown frequency $f_1$ is applied to the clock input C of D flip flop 25 then makes the output of said flip flop a logic one which serves as the START $f_b$ enable signal indicated at the top of FIG. 3. Thus the output of D flip flop 25 (FIG. 1) is applied to the D input of D flip flop 48 in FIG. 3 which is clocked by $0.1f_{b1}$ and the output Q of which is applied to another D flip flop 49, also clocked by $0.1f_{b1}$ on the one side and on the other to one of the inputs of AND gate 44 of which the other input is tied to the Q output of D flip flop 49. These two flip flops delay the START $f_b$ signal by at least one period of the frequency $0.1f_{b1}$ after which the output of AND gate 44 turns logic one to give START $f_b$ DELAYED which is applied to one of the inputs of AND gate 50 to the other input of which is tied one of the auxiliary frequencies $0.1\overline{f_{b1}}$. The pulses at the output of AND gate 50 are applied at the Enable input of a two stage binary counter 51,52 which can be of the type 4520 (14520) DUAL BINARY COUNTER. Such mentioned counters have four divide-by-two stages with separated outputs $Q_0$, $Q_1$, $Q_2$, $Q_3$, and Enable input E which counts the trailing edges of the applied input pulses at E, provided its clock input C and its reset input R, over which the counter can be zeroed (reset), are both on logic zero potential. Two pulses of the frequency $0.1f_{b1}$ after "START $f_b$" turns logic one, counter 51 receives at its Enable input E a pulse, which turns its ouput $Q_0$ to logic one. $Q_1$ turns logic one after four pulses $Q_2$ after eight etc. $Q_0$ of counter 52 after 32 pulses, $Q_1$ of counter 54 after 64 pulses etc. Each of these Q outputs is applied to two D flip flops as clock inputs. Thus $Q_0$ of counter 51 feeds the clock inputs C of D flip flops 53 and 63, both with D inputs on logic one ($V_{dd}$) to disable AND gate 73, as $\overline{Q}$ of I.C. 53 turns low after a clock pulse at its clock input C. The other input of gate 73 is tied to the common RESET $f_b$ signal. The output of gate 73 is applied to the RESET input of D flip flop 63. Similarly $Q_1$ of counter 51 works with D flip flops 54 and 64 and AND gate 74, $Q_2$ with D flip flops 55 and 65 and AND gate 75 and so on.

The Q outputs of D flip flops 63 through 70 are applied to one input of AND gates 83 through 90 respectively, the other input of these AND gates being tied to one of the Q outputs of binary counters 61 and 62 which comprise a Dual Binary Counter which is of the same type of the counter 51,52 already described. Thus the output of $Q_0$ of counter 61 is applied to one input of AND gate 83, $Q_1$ to AND gate 84 and so on. The output of AND gates 83 through 90 are OR'ed by OR gates 93 through 99 and the result at the output of OR gate 99 (Result $f_b$) is applied to one of the inputs of NOR gate 26 (FIG. 1) at the other input of which is applied the RANGE CONTROL signal.

Figure 4:
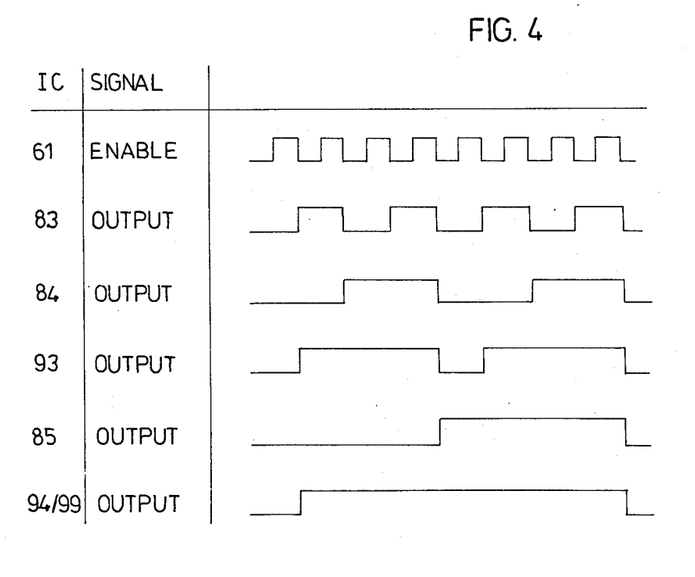
FIG. 4 is a pulse chart showing the timing of various pulses of FIG. 3.

As all OR'ed frequencies are synchronous and stand in a relation 1:2:4:8 ... etc. the lowest frequency will predominate at the output of OR gate 99. This fact is similar to the one encountered when discussing the OR'ing of frequencies $f_a$ and $2f_a$ at the input of OR gate 16 in FIG. 1. Counter 61 receives pulses of the frequency $20f_{b1}$ at its enable input E. Its output $Q_0$ has the frequency $20f_{b2}=20f_{b1}/2$ and is applied, as mentioned, to AND gate 83 which is enabled by means of D flip flop 63. This frequency at the output of gate 83 is OR'ed by OR gate 93 with the output of AND gate 84 which is enabled when the output of D flip flop 64 is logic one, which is the case when $Q_1$ of counter stage 51 turns logic one after four pulses of $0.1f_{b1}$ have passed since START $f_b$ turned logic one. The output of OR gate 93 is OR'ed with the output of AND gate 85 and then passes through OR gates 94 through 99 assuming the other inputs of these mentioned OR gates are logic zero. The results of these operations are shown in FIG. 4 where gates 83–85 are enabled.

Figure 5:
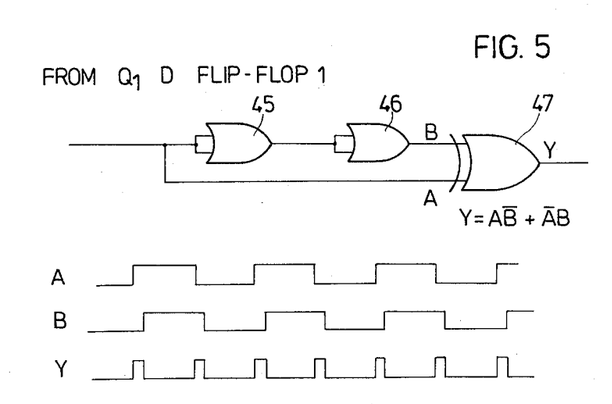
FIG. 5 is a multiply-by-two circuit configuration with corresponding pulse chart used in conjunction with FIG. 3.

FIG. 5 shows how the RESET $f_b$ pulses are produced. An EXCLUSIVE OR gate 47 receives at one of its inputs the pulses from the $Q_1$ output of J K flip flop 1 and at the other input the same pulses delayed by two gates 45 and 46 that can be of the OR type. The output of OR gate 47 consists of short pulses in the rhythm of input frequency $f_1$ or twice the frequencies at the $Q_1$ output of J K flip flop 1. These pulses are applied, over time delay $t_1$ (FIG. 3), to the RESET inputs of D flip flops 53 through 60 and, without the delay, to those D flip flops 63 through 70 whose corresponding AND gates 73 through 80 had not been disabled through the D flip flop chain 53 through 60. Time delay $t_1$ is necessary in order to ensure resetting of D flip flops 63 through 70 $t_1$ seconds before D flip flops 53 to 60 since otherwise all AND gates 73 through 80 would be enabled by the Q outputs of the corresponding D flip flops 53 through 60 turning logic one on resetting. For the same reason, the reset pulses must be of short duration otherwise AND gates 73 through 80 will be enabled by the $\bar{Q}$ outputs of D flip flops 53 through 60 all turning logic one after the application of such reset pulses that must be of shorter duration than the propagation delay of the mentioned D flip flops. Alternatively, $t_1$ must be chosen larger. The example of FIG. 3 can be chosen to work with $f_b{}^{max.}=fb_1=500$ Hz and $2f_{a\ max.}=20f_{b1}=10,000$ Hz. The output frequencies at the outputs $Q_0$ through $Q_3$ of counters 51 and 52 are as follows:

$0.1fb_2=25$ Hz, $0.1fb_3=12.5$ Hz, $0.1fb_4=12.5/2$ Hz, $0.1fb_5=12.5/4$ Hz, $0.1fb_6=12.5/8$ Hz, $0.1fb_7=12.5/16$ Hz, $0.1fb_8=12.5/32$ Hz, $0.1fb_9=12.5/64$ Hz.

The corresponding frequencies of counters 61 and 62 vary respectively between $200fb_2=5000$ Hz and $200fb_9=2500/64$ Hz.

If $f_1$ is higher than 100 Hz, D flip flops 48 and 49 are reset before the Q output of D flip flop 49 turns logic one and none of D flip flops 53 through 60 is enabled. The result is a logic zero for "RESULT $f_b$" which is applied in FIG. 1 to one of the inputs of NOR gate 26 whose other input receives the RANGE CONTROL signal which, in this case, is also logic zero, so that the output of NOR gate 26 turns logic one and turns LED 3 on. A LED 4 is used to indicate that the right $f_b$ is being used and that the counter is counting the pulses injected at J K flip flop 1 properly. 100 Hz is then the highest frequency in the described example where pulse multiplication or frequency shifting has been judged reasonable. Higher frequencies are indicated by LED 3 and can be measured by being directly applied at the input of counter 30 which counts frequencies directly up to 1 GHz.

The lowest frequency limit in the described example is $$f_1{}^{min.} = \frac{0.1fb_9}{5} = \frac{12.5}{64} \times \frac{1}{5} = \frac{25}{640} = 0.0391 \text{Hz}.$$

Figure 3:
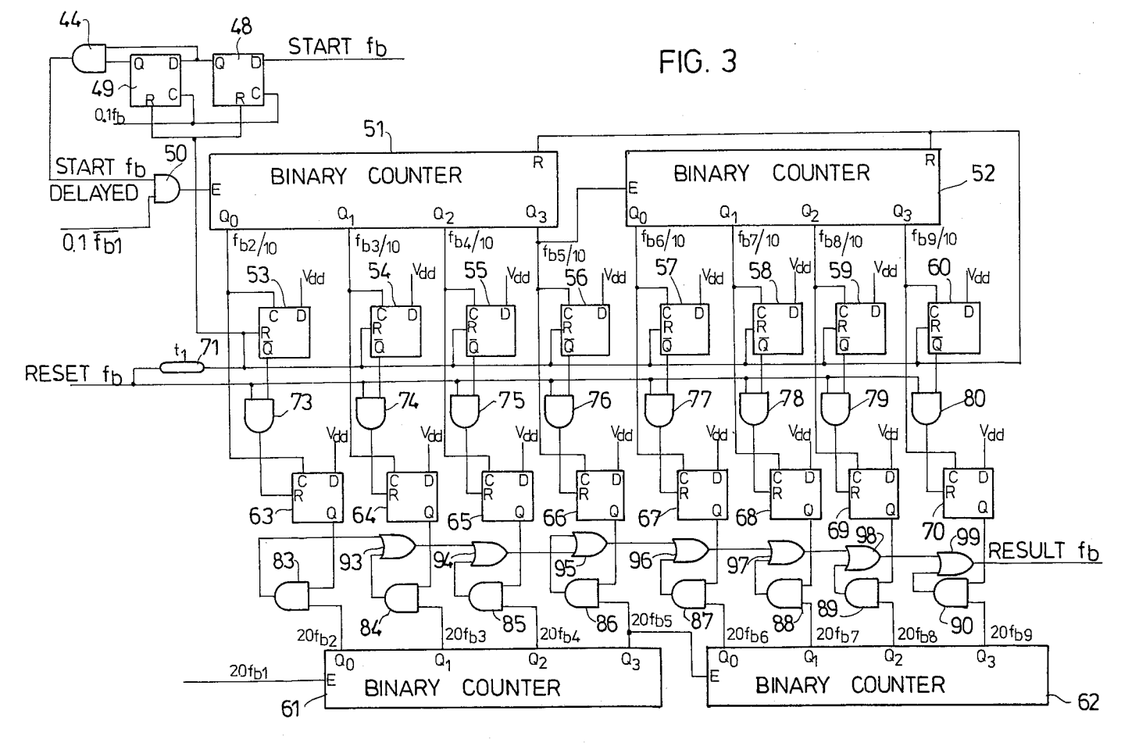
FIG. 3 is a block diagram of version 2 of a digital frequency shifter which is the preferred embodiment of the invention.

It must be noted that the circuits of FIGS. 1 and 3 are no more than an automatic period of estimation method for input frequency $f_1$. What is done is to define an auxiliary frequency $f_a$ within the limits of 50% or one octave (FIG. 3), as given by equation (6). Once $f_1$ is known up to 50%, which is the first approximation, the circuit of FIG. 1 inserts sufficient pulses between consecutive pulses of $f_1$ to produce the frequency shift. In the case of low frequency counters this resulting frequency shift will compensate the known accuracy and resolution drop at low frequencies as the resulting frequencies are no longer low. The circuit of FIG. 1 is used, among others, to measure the coincidences between the $f_b$ pulses injected in both multiplier channels. Once this overlapping ($f_a$ disable in FIG. 1) is known, $f_1$ is considered as measured. The output pulses at counter 30 are not equidistant, but this is due to the implementation and is not characteristic of the general method used.

Considering further the circuits of FIGS. 1 and 3 as a whole, equation 7 can be rewritten as follows $$K = \frac{20fb_1}{2^n f_s} \qquad (8)$$

$$f_s = \frac{20fb_1}{2^n K} \qquad (9)$$

where $n=1, 2, \ldots 8$

From equation 9 it follows that mentioned circuits do no more than divide the auxiliary frequency $20fb_1$ by powers of 2 and fractions hereof K to give $f_s=100f_1$.

Since the principles of the invention have now been made clear, it will be immediately obvious to those skilled in the art that many modifications of structure, arrangement, the elements, materials and components used in the practice of the invention and otherwise, which are particularly adapted for specific environments and operating requirements may be made without departing from the scope of the invention which is to be considered as limited only by the following claims.

I claim:

1. Digital frequency processing method comprising the steps of:
   (a) providing a first train of pulses having a first frequency $f_1$;
   (b) dividing said first train of pulses into a plurality of x second trains of pulses;
   (c) counting n pulses of a second frequency $f_b$ for each pulse of each second train of pulses; and
   (d) providing an output related to the total number of pulses of said second frequency which have been counted during a time base, said first and second frequencies obeying the following condition:

$$nf_1 \geq f_b \geq (n/x)f_1.$$

2. The method of claim 1 in which x is two and n is made equal to ten by counting, in said step c, said second frequency pulses in first and second resettable binary coded decimal counters for said two second pulse trains respectively.

3. The method of claim 2 in which said time base is controlled to begin automatically with the leading edge of one of the pulses of said first train.

4. Digital frequency processing method comprising the steps of:
   (a) providing a first train of pulses having a first frequency $f_1$;
   (b) dividing said first train of pulses into two trains of pulses inverted with respect to each other;
   (c) counting ten pulses of a first auxiliary frequency $f_b$ for each pulse of each said train of inverted pulses; and
   (d) counting, during a time base, the pulses of a second auxiliary frequency $f_a$ when said first auxiliary frequency pulses are being counted with respect to only one of said trains of inverted pulses, pulses of twice said second auxiliary frequency when said first auxiliary frequency pulses are being counted with respect to both of said trains of inverted pulses and no pulses when said first auxiliary frequency pulses are not being counted, said frequencies obeying the following conditions:

$$10f_1 \geq f_b \geq 5f_1;$$

and $$f_a = mf_b,$$

where m is a constant.

5. Method according to claim 4 in which m is ten.

6. Method of estimating a relation between two frequencies of the type $yf_1 > f_b > y/z\, f_1$ comprising generating a series of frequencies which diminish with respect to each other by a factor of z, comparing said frequency $f_1$ with said series of frequencies to determine the lowest of said frequencies which is still higher than said frequency $f_1$ and multiplying said selected frequency by y to produce said frequency $f_b$.

7. Method according to claim 6, in which y is 10 and z is 2.

8. Frequency processing circuit characterized in comprising:
   (a) a first pulse generator having an input receiving a signal of a first frequency $f_1$ and a plurality of outputs at which appear a plurality of x trains of pulses;
   (b) time-measuring circuit means having pulse inputs connected to the corresponding outputs of said pulse generator, said time-measuring circuit means having respective outputs which have a given logic state during a predetermined time period after the beginning of each pulse appearing at the corresponding pulse generator output;
   (c) a pulse injecting means having an input related to a second frequency $f_a$, and an output connected to a counter, said pulse injector circuit being associated with said time-measuring circuit means to control said pulse injector to inject pulses at said second frequency only when only one of said time-measuring circuit means outputs has said given logic state, and pulses at multiples of said second frequency, depending on the number of said time-measuring circuit means outputs which have said given logic state, said counter counting said injected pulse during a given time base.

9. Digital frequency processing method comprising the steps of:
   (a) providing a first train of pulses having a first frequency $f_1$;
   (b) providing an auxiliary frequency $f_b$ higher than said first frequency; and
   (c) diminishing said auxiliary frequency by dividing it consecutively by factors of $2^A$ where $2^A$ is an integer and comparing the results with said first frequency until $f_b$ equals $10^z f_1$ where $z = 0, 1, 2, \ldots$ when $f_1$ is a power of $2^A$ and by factors of $2^A$ and ultimately by a fraction of $2^A$ until $f_b = 10^z f_1$ when $f_1$ is not a power of $2^A$, one of said first and auxiliary frequencies being known.

10. Digital frequency processing method according to claim 9 in which $A = 1$.

11. Digital frequency processing method according to claim 9 where $A = \text{LOG}_2 10$.

12. Digital frequency processing method comprising the steps of:
   (a) providing a first train of pulses having a frequency $f_1$;
   (b) dividing said first train of pulses into two second trains of pulses;
   (c) counting ten pulses of a second frequency $f_b$ in respective first and second resettable binary code decimal counters for each pulse of each of said two second trains of pulses; and
   (d) providing an output related to the total number of pulses of said second frequency which has been counted during a time base, by counting pulses of a third frequency $f_a$ when only one of said first and second counters is counting and pulses of twice said third frequency when both of said first and second counters are counting simultaneously, said first and second frequencies obeying the following relation:

$$10f_1 \geq f_b \geq 5f_1.$$

13. The method of claim 12 in which said time base is controlled to begin automatically with the leading edge of one of the various said pulses.

14. Digital frequency processing method comprising the steps of:
   (a) providing a first train of pulses having a first frequency $f_1$;

(b) dividing said first train of pulses into a plurality of x second trains of pulses;

(c) counting n pulses of a second frequency $f_b$ for each pulse of each second train of pulses; and (d) providing an output related to the total number of pulses of said second frequency which have been counted during a time base, said first and second frequencies obeying the following condition:

$$nf_1 \geq f_b \geq (n/x) f_1$$

said condition being satisfied automatically by generating a series of third frequencies which diminish with respect to each other by a factor of x, comparing said first frequency with said series of third frequencies to determine between which pair of said third frequencies lies said first frequency, selecting the lower of said pair of third frequencies and multiplying it by n to produce said second frequency.

15. The method of claim 14 in which said step (d) comprises counting m pulses of a further frequency $f_a$ for each pulse counted of said second frequency, said further frequency and said second frequency both being generated from said selected third frequency.

16. Digital frequency processing method comprising the steps of:

(a) providing a first train of pulses having a first frequency $f_1$;

(b) dividing said first train of pulses into two trains of pulses inverted with respect to each other;

(c) counting ten pulses of a first auxiliary frequency $f_b$ for each pulse of each said train of inverted pulses; and (d) counting during a time base, the pulses of a second auxiliary frequency $f_a$ when said first auxiliary frequency pulses are being counted with respect to only one of said trains of inverted pulses, pulses of twice said second auxiliary frequency when said first auxiliary frequency pulses are being counted with respect to both of said trains of inverted pulses and no pulses when said first auxiliary frequency pulses are not being counted, said frequencies obeying the following conditions:

$$10f_1 \geq f_b \geq 5f_1;$$

and $$f_a = 10f_b,$$

said conditions being satisfied automatically by providing frequencies $0.1f_{b1}$ and $20f_{b1}$, applying each of said frequencies to respectively first and second binary counter means, producing respectively outputs of $0.1f_{b1}/2, 0.1f_{b1}/4 \ldots 0.1f_{b1}/L$ and $20f_{b1}/2, 20f_{b1}/4 \ldots 20f_{b1}/L$, where L is an integer representing the number of the last output of each said counter means, comparing the frequencies at the output of said first counter means with said first frequency to determine the lowest frequency output of said first counter means, which is still higher than said first frequency and selecting the corresponding output of said second counter means as the lowest frequency selected second counter means output, and using said selected second counter means output as twice said second auxiliary frequency $2f_a$, dividing said selected output by two to provide a frequency signal at least proportional to said second auxiliary frequency $f_a$ and dividing said selected output by 20 to provide said first auxiliary frequency $f_b$.

17. Method according to claim 16 in which each of said first and second counter means comprises a pair of binary counters, to provide 8 outputs whereby L is 8.

18. The method of claim 16 in which said time base is controlled to begin automatically with the leading edge of one of the various said pulses.

19. Digital frequency processing method comprising the steps of:

(a) providing a first train of pulses having a first frequency $f_1$;

(b) dividing said first train of pulses into a plurality of p second trains of pulses;

(c) counting n pulses of a second frequency $f_b$ for each pulse of each of said p second trains of pulses; and (d) providing an output related to the total number of pulses of said second frequency which have been counted during a time base, said first and second frequencies obeying the following condition:

$$nf_1 \geq f_{bp} \geq (nf_1/x)$$

said condition being satisfied automatically by generating a series of third frequencies which diminish with respect to each other by a factor of x, comparing continuously said second trains of pulses with said series of third frequencies to determine between which pair of said third frequencies lies each of said second train of pulses, selecting the lower of said pair of third frequencies and multiplying it by n to produce said second frequency.

20. The method of claim 19 in which said step d comprises counting m pulses of a further frequency $f_a$ for each pulse counted of said second frequency, said further frequency and said second frequency both being generated from said selected third frequency.

21. Digital frequency processing method comprising the steps of:

(a) providing a first train of pulses having a first frequency $f_1$;

(b) dividing said first train of pulses into two trains of pulses inverted with respect to each other;

(c) counting n pulses of a first auxiliary frequency $f_b$ for each pulse of each said train of inverted pulses; and (d) counting during a time base, the pulses of a second auxiliary frequency $f_a$ when said first auxiliary frequency pulses are being counted with respect to only one of said trains of inverted pulses, pulses of twice said second auxiliary frequency when said first auxiliary frequency pulses are being counted with respect to both of said trains of inverted pulses and no pulses when said first auxiliary frequency pulses are not being counted, said frequencies obeying the following conditions:

$$n f_1 \geq f_b \geq (n/2) f_1;$$

and $$f_a = mf_b, \text{ where m is a constant,}$$

said condition being satisfied automatically by providing frequencies $0.1f_{b1}$ and $20f_{b1}$, applying each of said frequencies to respectively first and second binary counter means, producing respectively outputs of $0.1f_{b1}/2, 0.1f_{b1}/4 \ldots 0.1f_{b1}/L$ and $20f_{b1}/2, 20f_{b1}/4 \ldots 20f_{b1}/L$, where L is an integer representing the number of the last output of each said counter means, comparing the frequencies at the output of said first counter means with said first frequency to determine the lowest frequency output of said first counter means, which is still higher than said first frequency and selecting the corresponding output of said second counter means as the lowest frequency selected second counter means output and using said selected second counter means output as twice said second auxiliary frequency $2 f_a$, dividing said selected output by two to provide a frequency signal at least proportional to said second auxiliary frequency $f_a$ and dividing said selected output by 20 to provide said first auxiliary frequency $f_b$.

22. The method of claim 21 in which said time base is controlled to begin automatically with the leading edge of one of the various said pulses.

* * * * *